United States Patent
Yun et al.

(10) Patent No.: US 7,964,332 B2
(45) Date of Patent: Jun. 21, 2011

(54) METHODS OF FORMING A PATTERN OF A SEMICONDUCTOR DEVICE

(75) Inventors: Hyo-Jin Yun, Anyang-si (KR); Young-Ho Kim, Yongin-si (KR); Boo-Deuk Kim, Suwon-si (KR); Ji-Man Park, Osan-si (KR); Jin-A Ryu, Hwaseong-si (KR); Jae-Hee Choi, Bucheon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 186 days.

(21) Appl. No.: 12/339,863

(22) Filed: Dec. 19, 2008

(65) Prior Publication Data

US 2009/0162796 A1 Jun. 25, 2009

(30) Foreign Application Priority Data

Dec. 20, 2007 (KR) .................... 10-2007-0134060

(51) Int. Cl.
*G03F 7/00* (2006.01)
*G03F 7/004* (2006.01)
*G03F 7/11* (2006.01)
*G03F 7/26* (2006.01)

(52) U.S. Cl. .............. 430/270.1; 430/273.1; 430/913; 430/927; 430/905

(58) Field of Classification Search .......... 430/270.1, 430/273.1, 905, 945, 913, 927
See application file for complete search history.

(56) References Cited

U.S. PATENT DOCUMENTS

| | | | | |
|---|---|---|---|---|
| 5,118,761 | A * | 6/1992 | Dharmarajan et al. | 525/210 |
| 5,939,236 | A * | 8/1999 | Pavelchek et al. | 430/273.1 |
| 6,110,653 | A * | 8/2000 | Holmes et al. | 430/325 |
| 6,261,743 | B1 * | 7/2001 | Pavelchek et al. | 430/325 |
| 6,468,718 | B1 * | 10/2002 | Kang et al. | 430/281.1 |
| 7,030,201 | B2 * | 4/2006 | Yao et al. | 526/260 |
| 7,070,914 | B2 * | 7/2006 | Neisser et al. | 430/322 |
| 7,189,491 | B2 * | 3/2007 | Rahman | 430/270.1 |
| 7,326,509 | B2 * | 2/2008 | Arase et al. | 430/270.1 |

(Continued)

FOREIGN PATENT DOCUMENTS

JP 2000-098595 4/2000
JP 2006009694 A * 1/2006

OTHER PUBLICATIONS

MAchine translation of JP2006009694A (no date).*

*Primary Examiner* — Amanda C. Walke
(74) *Attorney, Agent, or Firm* — F. Chau & Associates, LLC

(57) ABSTRACT

In polymers for an anti-reflective coating, compositions for an anti-reflective coating and methods of forming a pattern of a semiconductor device using the same, the compositions for an anti-reflective coating include a polymer that includes a first repeating unit having a basic side group, a second repeating unit having a light-absorbing group, and a third repeating unit having a cross-linkable group; a photoacid generator; a cross-linking agent; and a solvent. The polymer for the anti-reflective coating, which may have a basic side group chemically bound to a backbone of the polymer, may properly adjust diffusion of an acid in an anti-reflective coating layer to improve the profile of a pattern.

15 Claims, 4 Drawing Sheets

U.S. PATENT DOCUMENTS

| | | |
|---|---|---|
| 7,465,531 B2 * | 12/2008 | Kim et al. .................... 430/313 |
| 7,745,077 B2 * | 6/2010 | Thiyagarajan et al. ......... 430/14 |
| 2002/0132183 A1 * | 9/2002 | Jung et al. .................. 430/270.1 |
| 2003/0215736 A1 * | 11/2003 | Oberlander et al. ....... 430/270.1 |
| 2005/0074688 A1 | 4/2005 | Toukhy et al. |
| 2009/0104559 A1 * | 4/2009 | Houlihan et al. .......... 430/270.1 |

* cited by examiner

METHODS OF FORMING A PATTERN OF A SEMICONDUCTOR DEVICE

CROSS-REFERENCE TO RELATED APPLICATIONS

This application claims priority under 35 U.S.C. §119 to Korean patent Application No. 2007-134060, filed on Dec. 20, 2007, the disclosure of which is hereby incorporated by reference herein in its entirety.

BACKGROUND

1. Technical Field

Example embodiments relate to polymers for an anti-reflective coating, compositions for an anti-reflective coating and to methods of forming a pattern of a semiconductor device. More particularly, example embodiments relate to polymers for an anti-reflective coating that may be developed by a developing solution, compositions for an anti-reflective coating and to methods of forming a pattern of a semiconductor device.

2. Description of the Related Art

As semiconductor devices having high operational speeds and large capacitances are in high demand, semiconductor manufacturing processes have been developed to improve the integration degrees, reliability and/or response speeds of semiconductor devices. Various methods for forming a fine pattern (e.g., a photolithography process) have been developed to enhance the integration degree of the semiconductor devices.

For example, with a photolithography process, a photoresist pattern may be formed using a photoresist composition. Generally, the photoresist composition may have solubility in a developing solution, which may be significantly different before and after exposure to light. Therefore, a photoresist pattern may be formed by a coating process using the photoresist composition, an exposing process and a developing process. A photoresist film may often be formed on a substrate on which a highly reflective layer and/or a structure having a stepped portion or an irregular surface may be formed. In such a case, light passing through the photoresist film may be readily reflected again toward the photoresist film by the underlying layer or structure. The reflected light to the photoresist film may cause reflective notching, standing wave effect and/or non-uniformity in a dimension of a photoresist pattern. Accordingly, an anti-reflective coating layer, which may absorb light in a wavelength range used as a light source in the exposure process, has been developed to suppress such reflection of light toward the photoresist film.

The anti-reflective coating layer may be classified into either an inorganic anti-reflective coating layer or an organic anti-reflective coating layer. The inorganic anti-reflective coating layer may be formed by a deposition process, e.g., a chemical vapor deposition (CVD) process. The organic anti-reflective coating layer may be generally formed by a spin coating process.

The organic anti-reflective coating layer may be conventionally patterned by a dry etching process. However, a loss of thickness of a photoresist pattern may occur while the organic anti-reflective coating layer is patterned by the dry etching process. To provide a sufficient thickness for the photoresist pattern, a method of increasing the thickness of the photoresist film has been suggested. As the resolution of a photoresist pattern significantly increases, an additional reduction in the thickness of the photoresist pattern may be required. Methods for overcoming difficulties associated with photoresist loss and also producing a pattern having an improved profile or fineness are still needed in the art.

SUMMARY

Example embodiments may provide polymers for an anti-reflective coating that may suppress diffusion of an acid in an anti-reflective coating layer to improve a profile of a pattern.

Example embodiments may also provide compositions for an anti-reflective coating that include the above-mentioned polymers.

Example embodiments may also provide methods of forming a pattern of a semiconductor device using the above-mentioned compositions.

In accordance with an example embodiment of the present invention, a polymer for an anti-reflective coating is provided. The polymer may include a first repeating unit represented by Formula 1 and having a basic side group, a second repeating unit having a light-absorbing group, and a third repeating unit having a cross-linkable group,

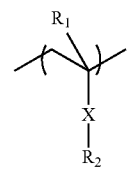

[Formula 1]

wherein $R_1$ is a hydrogen atom or $C_1$-$C_4$ lower alkyl, —X— is a divalent group selected from the group consisting of alkylene, arylene, oxyalkylene, alkyleneoxy, oxyarylene, aryleneoxy, carbonyl, oxy, oxycarbonyl, carbonyloxy, carbonylalkylene, carbonylarylene, alkylenecarbonyl, arylenecarbonyl and combinations thereof, and $R_2$ is the basic side group having nitrogen, the basic side group being selected from the group consisting of amino; alkylamino; alkenylamino; arylamino; alkanoylamino; alkyl, alkenyl, cycloalkyl, cycloalkenyl and aryl, each of which is substituted by at least one selected from amino, alkylamino, alkenylamino, arylamino and alkanoylamino; and heterocycloalkyl, heterocycloalkenyl and heteroaryl, each of which has a nitrogen hetero atom.

In an example embodiment, the polymer may include the first repeating unit in a range of, for example, about 0.1 to about 5% by weight, based on a total weight of the polymer. In an example embodiment, the polymer may have a weight-average molecular weight of, for example, about 5,000 to about 10,000.

In accordance with an example embodiment of the present invention, a composition for an anti-reflective coating is provided. The composition may include a polymer including a first repeating unit represented by Formula 1 and having a basic side group, a second repeating unit having a light-absorbing group, and a third repeating unit having a cross-linkable group; a photoacid generator; a cross-linking agent; and a solvent.

In accordance with another example embodiment of the present invention, a method of forming a pattern of a semiconductor device is provided. The method includes forming an anti-reflective coating layer on a substrate using a composition that may include a polymer, a photoacid generator, a cross-linking agent and a solvent. The polymer may include a first repeating unit represented by Formula 1 and having a basic side group, a second repeating unit having a light-absorbing group, and a third repeating unit having a cross-linkable group. The method further includes forming a photoresist film on the anti-reflective coating layer, exposing the photoresist film and the anti-reflective coating layer to light, and then developing the photoresist film and the anti-reflective coating layer to form a photoresist pattern and an anti-reflective coating layer pattern on the substrate.

According to example embodiments, the polymers for the anti-reflective coating may include a basic side group having a nitrogen atom to suppress diffusion of an acid which may be generated from an exposed portion of an anti-reflective coating layer or transferred from a photoresist film. Therefore, the polymers may inhibit a defect (e.g., undercut) of a pattern and also improve a profile of a pattern.

Further, the compositions may include a polymer having a basic side group which is chemically bound to the polymer, and thus the basic component of the anti-reflective coating layer may be prevented from being dissolved in an adjacent photoresist film. Accordingly, the composition including such polymer may effectively inhibit acid diffusion in the anti-reflective coating layer to improve the profile of a pattern.

BRIEF DESCRIPTION OF THE DRAWINGS

Example embodiments can be understood in more detail from the following description taken in conjunction with the accompanying drawings. FIGS. 1-4B represent non-limiting, example embodiments as described herein.

FIG. 2 is an electronic microscopic picture showing a pattern structure formed using the composition for the anti-reflective coating prepared in Example 4;

FIG. 3 is an electronic microscopic picture showing a pattern structure formed using the composition for the anti-reflective coating prepared in Comparative Example 3; and FIGS. 4A-4B are cross-sectional views illustrating undercut of pattern structures formed using the compositions prepared in Comparative Examples 2 and 3.

DETAILED DESCRIPTION OF EXAMPLE EMBODIMENTS

Figure 1A:
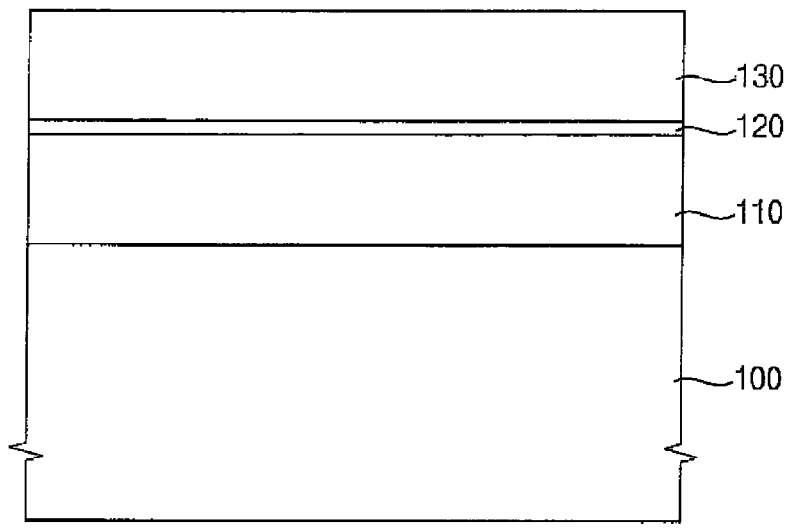
FIGS. 1A-1D are cross-sectional views illustrating a method of forming a pattern of a semiconductor device in accordance with an example embodiment.

Various example embodiments will be described more fully hereinafter with reference to the accompanying drawings, in which some example embodiments are shown. Example embodiments may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In example embodiments, "alkyl" may denote a saturated straight, branched or ring hydrocarbon chain, "alkenyl" may denote an unsaturated straight, branched or ring hydrocarbon chain. Alkyl may have 1-30 carbon atoms in some embodiments, and 1-10 carbon atoms in other embodiments. Alkenyl may have 2-30 carbon atoms in some embodiments, and 2-10 carbon atoms in other embodiment. Alkyl and alkenyl may be substituted or unsubstituted by one or more of substituents. Examples of alkyl may include but are not limited to methyl, ethyl, propyl, isopropyl, n-butyl, t-butyl, cycloproply, etc. Examples of alkenyl may include but are not limited to ethenyl, propenyl, butenyl, cyclohexenyl, etc.

In example embodiments, "cycloalkyl" and "cycloalkenyl" may denote compounds having a ring hydrocarbon chain out of alkyl and alkenyl, respectively. Cycloalkyl and cycloalkenyl may have one, two or more of ring numbers, and may have 3-20 carbon atoms. Examples of cycloalkyl may include but are not limited to cyclopropyl, cyclobutyl, cyclopentyl, cyclohexyl, cyclonorbonanyl, etc., and examples of cycloalkenyl may include but are not limited to cyclohexenyl, norbornenyl, etc. "Aryl" may denote an aromatic hydrocarbon chain, may have one, two or more of ring numbers, and may have 3-30 carbon atoms. Examples of aryl may include but are not limited to phenyl, naphthyl, anthracenyl, etc. Aryl may be substituted or unsubstituted by one or more of substituents. "Hetero" of heterocycloalkyl, heterocycloalkenyl and heteroaryl may mean that one or more of carbon atoms of a ring are substituted by other elements, e.g., nitrogen, oxygen or sulfur.

Polymers for Anti-Reflective Coating

According to example embodiments, a polymer for an anti-reflective coating may include a first repeating unit represented by, for example, Formula 1 and having a basic side group, a second repeating unit having a light-absorbing group, and a third repeating unit having a cross-linkable group.

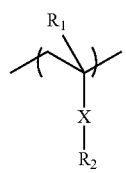

[Formula 1]

In Formula 1, $R_1$ may be, for example, a hydrogen atom or $C_1$-$C_4$ lower alkyl, —X— may be, for example, a divalent group selected from the group consisting of alkylene, arylene, oxyalkylene, alkyleneoxy, oxyarylene, aryleneoxy, carbonyl, oxy, oxycarbonyl, carbonyloxy, carbonylalkylene, carbonylarylene, alkylenecarbonyl, arylenecarbonyl and combinations thereof, and $R_2$ may be, for example, the basic side group having nitrogen, the basic side group being selected from the group consisting of, for example, amino; alkylamino; alkenylamino; arylamino; alkanoylamino; alkyl, alkenyl, cycloalkyl, cycloalkenyl and aryl, each of which is substituted by at least one selected from amino, alkylamino, alkenylamino, arylamino and alkanoylamino; and heterocycloalkyl, heterocycloalkenyl and heteroaryl, each of which has a nitrogen hetero atom.

The polymer may include the first repeating unit having a basic side group $R_2$. The basic side group chemically bound to a backbone chain of the polymer may properly control diffusion of an acid ($H^+$) in an anti-reflective coating layer. The acid may be generated from an exposed portion of the anti-reflective coating layer and/or may be transferred from an exposed portion of the photoresist film on the anti-reflective coating layer. The basic group of the first repeating unit may inhibit the acid from diffusing from an exposed portion to an unexposed portion of the anti-reflective coating layer, and therefore a profile of a pattern may be improved.

In example embodiments, non-limiting examples of $R_1$ may include a hydrogen atom, methyl, ethyl, propyl, isopropyl, butyl or t-butyl. Non-limiting examples of —X— may include —COO—, —CO—, —O—, —$(CH_2)$n-, —$(CH_2)$nO—, —O$(CH_2)$n-, —O$(CH_2)$nO—, —COO$(CH_2)$n-, —CO$(CH_2)$n-, —$(CH_2)$nOOC—, —$(CH_2)$nCO—, —COO$(CH_2)$nOOC—, —COO$(CH_2)$nCO—, —CO$(CH_2)$nOOC—, —CO$(CH_2)$nCO—, —Ar—, —ArO—, —OArO—, —OAr—, —COOAr— and/or —COAr. In these formulas, n may be an integer of, for example, about 1 to about 30. In some example embodiments, —X— may be, for example, carbonyl. In other example embodiments, —X— may be, for example, carbonyloxy. In still other example embodiments, —X— may be, for example, carbonyloxy-alkylene-oxycarbonyl.

In example embodiments, non-limiting examples of $R_2$ may include morpholinyl, amino-substituted norbonanyl, amino, methylamino, ethylamino, dimethylamino, aminoethyl, aminopropyl, aminobutyl, aminocyclohexyl, amino-substituted adamantanyl, aminophenyl, pyrrolidinyl, pyrrolyl, piperidinyl, piperazinyl, pyrazinyl, pyridinyl, pyrimidinyl or imidazolyl. In some example embodiments, $R_2$ may be, for example, substituted or unsubstituted morpholinyl. In other example embodiments, $R_2$ may be, for example, substituted or unsubstituted amino norbonanyl.

In example embodiments, the polymer may include the first repeating unit in a range of, for example, about 0.05 to about 5% by weight based on a total weight of the polymer. In some example embodiments, the polymer may include the first repeating unit in a range of, for example, about 0.1 to about 1% by weight, or about 0.1 to about 0.5% by weight. In other example embodiments, the polymer may include the first repeating unit in a range of, for example, about 0.05 to about 5% by mole based on total moles of repeating units. In still other example embodiments, the polymer may include the first repeating unit in a range of, for example, about 0.1 to about 1% by mole or about 0.1 to about 0.5% by mole, based on total moles of repeating units.

When the content of the first repeating unit is less than about 0.05% by weight, diffusion of an acid in the anti-reflective coating layer may not be sufficiently suppressed. When the acid diffuses from an exposed portion to an unexposed portion of the anti-reflective coating layer, the unexposed portion of the anti-reflective coating layer may be unintentionally removed during a developing process. Accordingly, an undercut or a recessed edge portion of a pattern may be generated. When the content of the first basic unit is greater than about 5% by weight, diffusion of an acid may be excessively inhibited. When breakage of a cross-linking in the exposed portion of the anti-reflective coating layer, which may be initiated by the acid, does not uniformly occur, a fine pattern of the anti-reflective layer may not be obtained. For example, a T shape profile of a pattern may be formed, or footing of a pattern, caused by incomplete removal of an exposed portion, may be generated.

In example embodiments, the polymer may include a second repeating unit having a light-absorbing group. The second repeating unit having the light-absorbing group may adsorb light passing through a photoresist film formed on the anti-reflective coating layer during an exposure process. Accordingly, the polymer including the second repeating unit may inhibit light from being reflected by a substrate or an underlying reflective layer toward a photoresist film. Reflective notching, standing wave effect and/or non-uniformity of a line width may also be reduced or suppressed.

In example embodiments, the second repeating unit may be a repeating unit having a light-absorbing group that may effectively absorb light used in an exposure process. For example, a backbone of the second repeating unit may be poly(meth)acrylate, polyester, polyamide, polysulfone, vinyl polymer and the like. Non-limiting examples of the light-absorbing group may include substituted- or unsubstituted-phenyl, naphthyl, anthracenyl, phenanthryl, acrydinyl, quinolinyl, diazo quinolinyl and the like.

In some example embodiments, the second repeating unit may be, for example, an (meth)acrylate repeating unit having substituted- or unsubstituted-naphthyl. In other example embodiments, the second repeating unit may be, for example, an (meth)acrylate repeating unit having substituted- or unsubstituted-anthracenyl. Non-limiting examples of a substituent attached to naphtyl or anthracenyl may include a halogen atom, hydroxyl, alkyl, hydroxyalkyl, haloalkyl, carboxyl, alkylcarboxyl, alkylcarbonyl, alkoxycarbonyl, alkylcarbonyloxy, etc. These may be used alone or in a combination thereof.

The polymer may include a third repeating unit having a cross-linkable group. The cross-linkable group of the third repeating unit may be reacted with a cross-linking agent by the aid of heat to form a cured anti-reflective coating layer. Additionally, the cross-linkable group of the third repeating unit may be separated from the cross-linking agent in the presence of an acid. The cross-linkable group of the third repeating unit may also improve solubility of the polymer in a solvent.

In example embodiments, a backbone of the third repeating unit may be, for example, poly(meth)acrylate, polyester, polyamide, polysulfone, vinyl polymer and the like. The cross-linkable group of the third repeating unit may be a group that may be cross-linked with a cross-linking agent, e.g., melamine, urea, polyalcohol, etc. Non-limiting examples of the cross-linkable group may include carboxyl; hydroxyl; or alkyl, cycloalkyl, aryl, haloalkyl, alkoxy, haloalkoxy, alkoxycarbonyl, haloalkoxycarbonyl and the like, each of which is substituted by at least one of carboxyl and hydroxyl.

In some example embodiments, the third repeating unit may be, for example, a vinyl repeating unit having a hydroxyl-substituted haloalkoxy side group. In other example embodiments, the third repeating unit may be, for example, an (meth)acrylic acid repeating unit having a carboxyl side group. In still other example embodiments, the third repeating unit may be, for example, a phenol repeating unit having a hydroxyl-substituted phenyl side group.

In example embodiments, the polymer may be represented by, for example, Formulas 2 or 3.

[Formula 2]

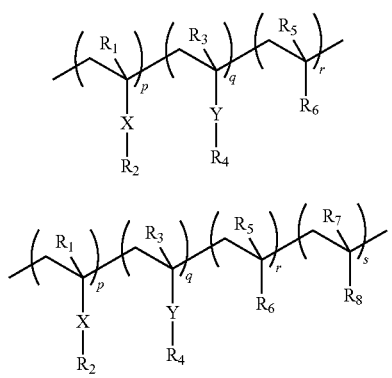

[Formula 3]

In Formulas 2 and 3, $R_1$, $R_3$, $R_5$ and $R_7$ may be independently, for example, a hydrogen atom or $C_1$-$C_4$ alkyl, —X— and —Y— may be independently, for example, a divalent group, e.g., alkylene, arylene, oxyalkylene, alkyleneoxy, oxyarylene, aryleneoxy, carbonyl, oxy, oxycarbonyl, carbonyloxy, carbonylalkylene, carbonylarylene, alkylenecarbonyl, arylenecarbonyl and combinations thereof, $R_2$ may be, for example, the basic side group having nitrogen, e.g., amino; alkylamino; alkenylamino; arylamino; alkanoylamino; alkyl, alkenyl, cycloalkyl, cycloalkenyl and aryl, each of which is substituted by at least one selected from amino, alkylamino, alkenylamino, arylamino and alkanoylamino; and heterocycloalkyl, heterocycloalkenyl and heteroaryl, each of which may have a nitrogen hetero atom, $R_4$ may be, for example, a light-absorbing group, $R_6$ and $R_8$ may be, for example, different from each other and selected from carboxyl; hydroxyl; and alkyl, cycloalkyl, aryl, haloalkyl, alkoxy, haloalkoxy, alkoxycarbonyl and haloalkoxycarbonyl, each of which may be substituted by at least one of carboxyl and hydroxyl. In Formula 2, p, q and r may, for example, satisfy $0<p<1$, $0<q<1$, $0<r<1$, and $p+q+r=1$. In Formula 3, p, q, r and s may, for example, satisfy $0<p<1$, $0<q<1$, $0<r<1$, $0<s<1$ and $p+q+r+s=1$.

In example embodiments, the polymer may be represented by, for example, Formulas 4 to 6.

[Formula 4]

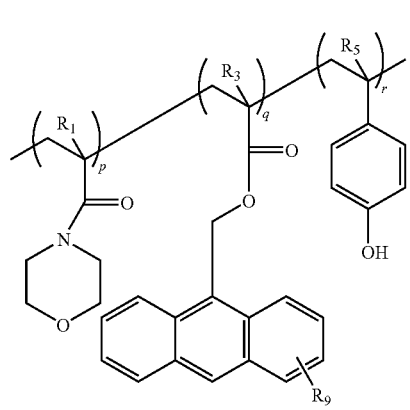

[Formula 5]

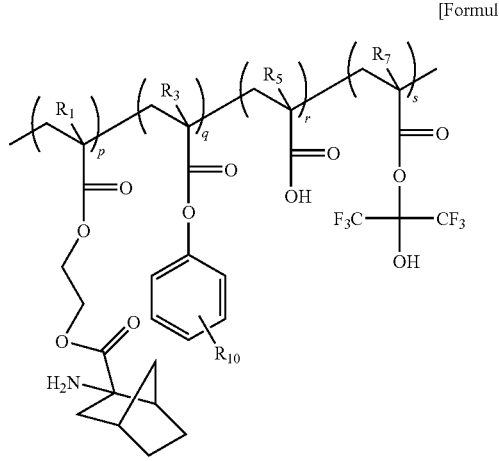

[Formula 6]

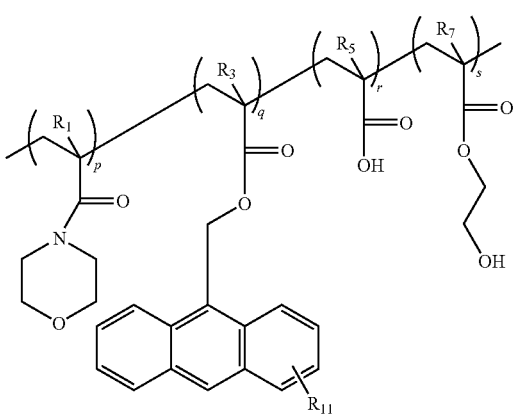

In Formulas 4 to 6, $R_1$, $R_3$, $R_5$ and $R_7$ may independently be, for example, a hydrogen atom or $C_1$-$C_4$ alkyl and $R_9$, $R_{10}$ and $R_{11}$ may independently be, for example, a hydrogen atom, a halogen atom, hydroxyl, alkyl, cycloalkyl, hydroxylalkyl, haloalkyl, carboxyl, alkylcarboxyl, alkylcarbonyl, alkoxycarbonyl or alkylcarbonyloxy. In Formula 4, p, q and r may, for example, satisfy $0<p<1$, $0<q<1$, $0<r<1$, and $p+q+r=1$. In Formulas 5 and 6, p, q, r and s may, for example, satisfy $0<p<1$, $0<q<1$, $0<r<1$, $0<s<1$ and $p+q+r+s=1$.

In example embodiments, the polymer may have a weight-average molecular weight in a range of, for example, about 1,000 to about 100,000. In some example embodiments, the polymer may have a weight-average molecular weight of, for example, about 5,000 to about 100,000. In other example embodiments, the polymer may have a weight-average molecular weight of, for example, about 5,000 to about 10,000.

According to example embodiments, the polymer for the anti-reflective coating may include the basic side group to properly inhibit an acid generated in an exposed portion from diffusing into an unexposed portion. Therefore, the polymer may reduce undercut of a pattern and also improve a profile of a pattern.

Compositions for an Anti-Reflective Coating

In example embodiments, a composition for an anti-reflective coating may include a polymer according to example embodiments, a photoacid generator, a cross-linking agent and a solvent. The polymer is previously described, so any further explanations in this regard will be omitted herein.

In example embodiments, a composition for an anti-reflective coating may be a composition for forming a developable bottom anti-reflective coating layer, which may be formed under a photoresist film and may be developed together with the photoresist film in a developing process. Accordingly, the composition may include a photoacid generator that may generate an acid by exposure to light, and a cross-linking agent that may cross-link chains of a polymer by heat and also de-cross-link the cross-linked polymer by an acid. Before an exposure process, an anti-reflective coating layer may be formed by, for example, thermally treating a coating layer of the composition to cross-link the polymer. The anti-reflective coating layer having the cross-linked polymer may not be readily dissolved in a photoresist composition, which may be applied onto the anti-reflective coating layer. After an exposure process, an exposed portion of the anti-reflective coating layer may be, for example, selectively de-cross-linked by an acid, and the exposed portion may be removed by a developing solution to form an anti-reflective coating layer pattern.

In example embodiments, the composition may include the polymer in a range of, for example, about 1 to about 25% by weight, based on a total weight of the composition. When the amount of the polymer is less than about 1% by weight, an anti-reflective coating layer and a pattern thereof may not be properly formed, and/or the anti-reflective coating layer may not sufficiently absorb light during an exposure process. When the amount of the polymer is greater than about 25% by weight, the viscosity of the composition may excessively increase to deteriorate the uniformity of the anti-reflective coating layer.

The photoacid generator that may be used in the composition for anti-reflective coating may be compounds that may be stimulated by light to generate an acid. Non-limiting examples of the photoacid generator may include a sulfonium salt, a triarylsulfonium salt, a diarylsulfonium salt, a monoarylsulfonium salt, an iodonium salt, a diaryliodonium salt, nitrobenzyl ester, a disulfone, a diazo-disulfone, a sulfonate, a trichloromethyl triazine, N-hydroxysuccinimide triflate, etc. These may be used alone or in a combination thereof.

In example embodiments, when the amount of the photoacid generator is less than about 0.001% by weight, the amount of an acid generated by exposure to light may be so small that a de-cross-linking reaction may not sufficiently occur in the exposed portion of the anti-reflective coating layer and thus the exposed portion of the anti-reflective coating layer may not be removed by a developing solution. When the amount of the photoacid generator is greater than about 10% by weight the acid may be excessively generated by the exposure process to unintentionally diffuse into an unexposed portion of the anti-reflective coating layer. In some example embodiments, the amount of the photoacid generator may be in a range of, for example, about 0.001 to about 10% by weight. In other example embodiments, the amount of the photoacid generator may be in a range of, for example, about 0.1 to about 6% by weight.

The cross-linking agent included in the composition may cross-link chains of the polymer by heat and also de-cross-link the cross-linked polymer by an acid. Non-limiting examples of the cross-linking agent may include melamine, urea, cyanuric acid, diol, triol, etc. These may be used alone or in a combination thereof.

In example embodiments, when the amount of the cross-linking agent is less than about 0.1% by weight, a cross-linking reaction between chains of the polymer may not sufficiently occur, and therefore, the anti-reflective coating layer may be dissolved in a photoresist composition which may be coated on the anti-reflective coating layer. When the amount of the cross-linking agent is greater than about 20% by weight, a cross-linking between chains of the polymer may be excessive and the exposed portion of the anti-reflective coating layer may not be readily remove by a developing process. In some example embodiments, the amount of the cross-linking agent may be in a range of, for example, about 0.1 to about 20% by weight. In other example embodiments, the amount of the cross-linking agent may be in a range of, for example, about 1 to about 15% by weight.

Non-limiting examples of the solvent that may be used in the composition may include ester, ether, lactone, ketone, glycol ether, glycol ester, or a combination thereof. Non-limiting examples of the solvent may include ethylene glycol monomethyl ether, ethylene glycol monoethyl ether, propylene glycol methyl ether, methyl cellosolve acetate, ethyl cellosolve acetate, diethylene glycol monomethyl ether, diethylene glycol monoethyl ether, propylene glycol methyl ether acetate, propylene glycol methyl ether, diethylene glycol dimethyl ether, ethyl lactate, methyl ethyl ketone, cyclohexanone, 2-heptanone, 3-heptanone, 4-heptanone, γ-butyrolactone, etc. These may be used alone or in a combination thereof.

In example embodiments, the composition may optionally include a thermal acid generator, a surfactant, a cross-linking activating agent, etc. The thermal acid generator may produce an acid by heat. A non-limiting example of the thermal acid generator may include a sulfone ester, e.g., cyclohexane toluene sulfone ester, cyclohexane propyl sulfone ester, cyclohexane methyl sulfone ester, cyclohexane octyl sulfone ester, etc. The surfactant may be a non-ionic, a cationic, an anionic and/or an amphiphilic surfactant. The cross-lining activating agent may be a compound that may promote a cross-linking reaction of the cross-linking agent, e.g., melamine, urea, etc.

According to example embodiments, the composition may include the polymer for the anti-reflective coating having a basic side group to suppress diffusion of an acid which may be generated from an exposed portion of an anti-reflective coating layer or transferred from a photoresist film. Therefore, the polymer may inhibit undercut of a pattern and also improve a profile of a pattern.

As compared with using a basic additive which is not chemically bound to the polymer to freely diffuse into an unexposed portion of an anti-reflective coating layer or an upper photoresist film, the polymer having the basic side group, which is chemically bound to the polymer, may not be dissolved in a photoresist film formed on an anti-reflective coating layer. Therefore, in example embodiments, the loss of a basic component of the anti-reflective coating layer may be prevented or reduced. Accordingly, the composition including such a polymer may effectively inhibit acid diffusion in the anti-reflective coating layer to improve a profile of a pattern structure.

Methods of Forming a Pattern of a Semiconductor Device

FIGS. 1A-1D are cross-sectional views illustrating a method of forming a pattern of a semiconductor device in accordance with example embodiments.

Referring to FIG. 1A, a layer 110 to be etched may be formed on a substrate 100. The substrate 100 may be, for example, a semiconductor substrate, on which a device, a layer, a film, a pattern, an electrode, a doping region, a diode, a wiring, a pad, a contact, a plug and/or other device structures may be formed. In example embodiments, the layer 110 may be an object to be etched by using a photoresist pattern 133 (see FIG. 1C) formed on the layer 100 as an etching mask. Non-limiting examples of the layer 110 may include an insulation layer, a conductive layer, a semiconductor layer, a mask layer, a barrier layer, a wafer and/or the like.

An anti-reflective coating layer 120 may be formed on the layer 110 by coating the substrate with a composition according to example embodiments. The composition for the anti-reflective coating may include a polymer having a basic side group, a photoacid generator, a cross-linking agent and a solvent. Explanations with regard to the composition may be the same as the previous descriptions. In example embodiments, the composition may be applied to the layer 110 by, for example, a spin coating method.

In example embodiments, the anti-reflective coating layer 120 may be formed by, for example, baking a coating layer of the composition. For example, the baking process may be performed, for example, at a temperature of about 150 to about 250° C. While the coating layer of the composition is thermally treated, chains of the polymer included in the coating layer may be cured or cross-linked by the cross-linking agent.

A photoresist film 130 may be formed on the anti-reflective coating layer 120 by using, for example, a photoresist composition. Types of the photoresist composition may not be limited to a specific type. For example, various photoresist compositions which is sensitive to light, e.g., ArF laser, KrF laser, electron beam, X-ray, Hg—Xe radiation, G-line radiation and/or I-line radiation, may be employed.

Figure 1B:
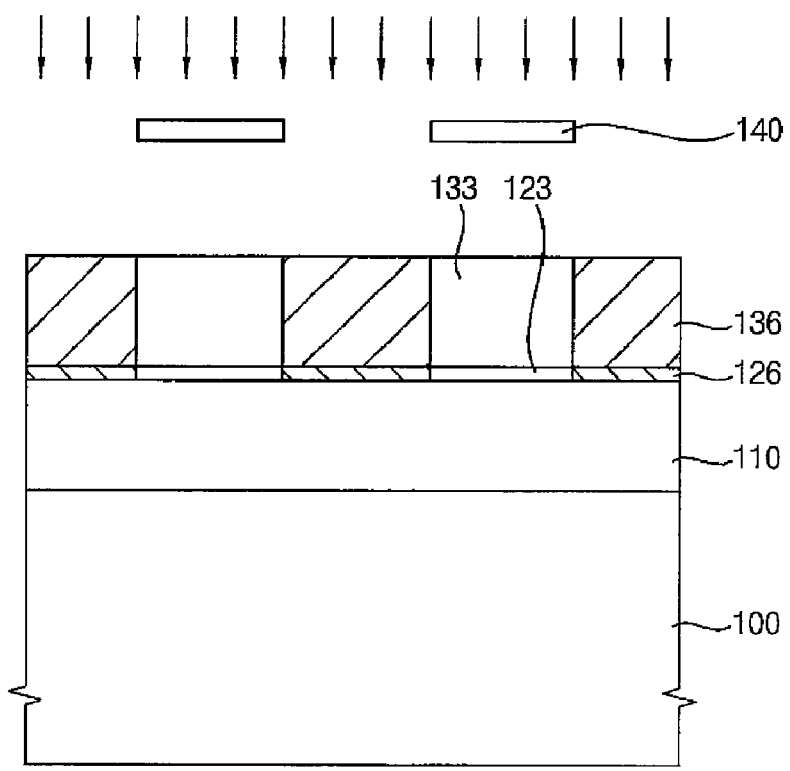

Referring to FIG. 1B, an exposure process may be performed by exposing the photoresist film 130 and the anti-reflective layer 120 to light passing through a photo mask 140. After performing the exposure process, the photoresist film may be divided into an exposed portion 136 and an unexposed portion 133, and the anti-reflective coating layer 120 may also be divided into an exposed portion 126 and an unexposed portion 123.

In the exposed portion 126 of the anti-reflective coating layer 120 and the exposed portion 136 of the photoresist film 130, an acid($H^+$) may be generated from a photoacid generator. The acid may change or de-cross-link a bond between chains of a polymer in the exposed portions 126 and 136, and thus the exposed portions 126 and 136 may be selectively converted to be soluble in a developing solution. In example embodiments, cross-linked chains of the polymer in the exposed portion 126 of the anti-reflective coating 120 may be de-cross-linked by the acid to be soluble in the developing solution.

In the exposure process, the polymer having the chemically-bound basic side group may properly control or suppress diffusion of the acid, which may be generated in the exposed portion 126 of the anti-reflective coating layer 120 and/or be transferred from the exposed portion 136 of the photoresist film 130. The chemically-bound basic side group may inhibit such the acid from moving or diffusing into the unexposed portion 123 of the anti-reflective coating layer 120. Accordingly, the unexposed portion 123 of the anti-reflective coating layer 120 may not be unintentionally removed or damaged to suppress undercut phenomena of a pattern, and profiles of an anti-reflective coating layer pattern and a photoresist pattern may be improved.

Figure 1C:
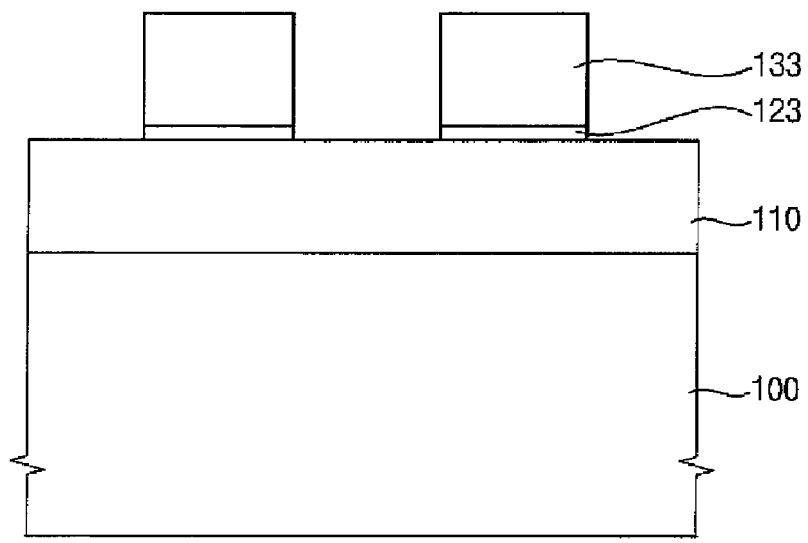

Referring to FIG. 1C, a developing process may be performed to selectively remove the exposed portion 136 of the photoresist film 130 and the exposed portion 126 of the anti-reflective coating layer 120. As a result, the unexposed portion 123 of the anti-reflective coating layer 120 and the unexposed portion 133 of the photoresist film 130 may remain on the layer 110 to form an anti-reflective coating layer pattern 123 and a photoresist pattern 133. In example embodiments, the developing process may be carried out using, for example, a basic developing solution, e.g., an aqueous solution of tetramethylammonium hydroxide. After performing the developing process, for example, a cleaning process and/or a rinsing process may be carried out to remove the developing solution and/or residues of photoresist and anti-reflective coating.

Figure 1D:
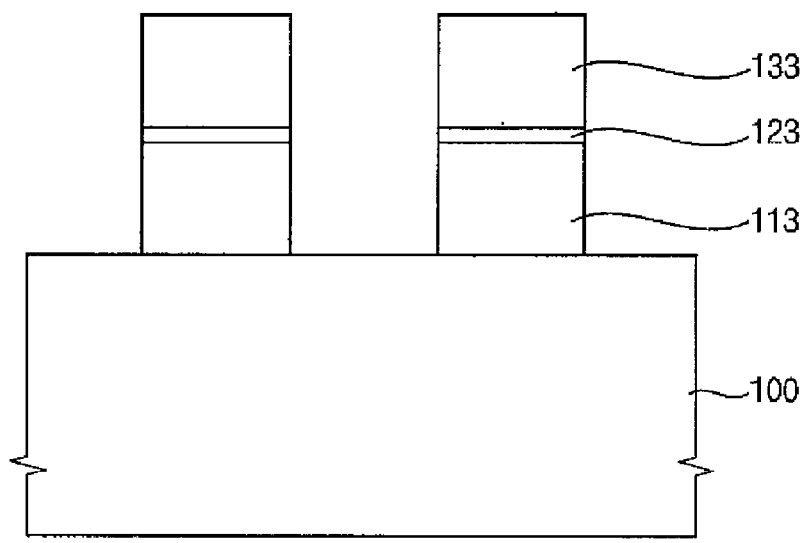

Referring to FIG. 1D, the layer 110 may be partially etched using the photoresist pattern 133 and the anti-reflective coating layer pattern 123 as etching masks. As a result, a pattern 113 may be formed on the substrate 100. By improving profiles of the anti-reflective coating layer pattern 123 and the photoresist pattern 133, the pattern 113 having an intended line width and an improved profile may be obtained.

Example embodiments will be further described hereinafter with reference to Synthetic Examples regarding synthesis of a monomer, and Examples and Comparative Examples regarding preparation of polymers and compositions for an anti-reflective coating. These are illustrative of example embodiments of the present invention and are not intended to be limiting of the present invention.

Synthesis of a Monomer Having a Basic Side Group

Synthetic Example 1

A monomer having a basic side group was prepared in accordance with Chemical Equation 1. 2-Amino-2-norbornanecarboxylic acid was reacted with an excessive amount of thionyl chloride ($SOCl_2$) to synthesize 2-amino-2-norbornanecarbonyl chloride. 2-(Methacryloyloxy)ethyl 2-aminobicyclo [2.2.1]heptane-2-carboxylate was obtained by reacting 2-amino-2-norbornanecarbonyl chloride with an excessive amount of 2-hydroxyethyl methacrylate.

[Chemical Equation 1]

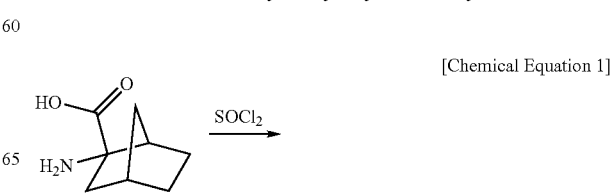

-continued

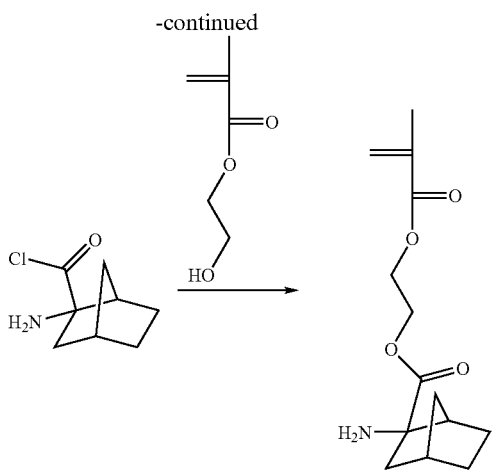

Preparation of Polymers for an Anti-Reflective Coating

Example 1

The monomer having a basic side group obtained in Synthetic Example 1, p-tolyl methacrylate, methacrylic acid and 1,1,1,3,3,3-hexafluoro-2-hydroxypropan-2-yl methacrylate were dissolved in tetrahydrofuran (THF) in a molar ratio of about 0.3:49.7:25:25. N,N'-Azodiisobutyronitrile (AIBN), an initiator, was added to into the THF solution including monomers, and then the monomers and the initiator were mixed under a nitrogen atmosphere. A polymerization was carried out by stirring the mixture at a temperature of about 65° C. for about 15 hours. The resulting product was cooled to a room temperature, and was diluted with THF. A polymer was precipitated using an organic solution including petroleum ether and diethyl ether in a volume ratio of about 5:1. As a result, a polymer for anti-reflective coating represented by Formula 7 was obtained. A yield of the polymer was about 87%, and a measured weight-average molecular weight of the polymer was about 7,500. A glass transition temperature of the obtained polymer was at least about 200° C. In an IR spectrum, O—C═O (1680 cm$^{-1}$) peak was observed.

[Formula 7]

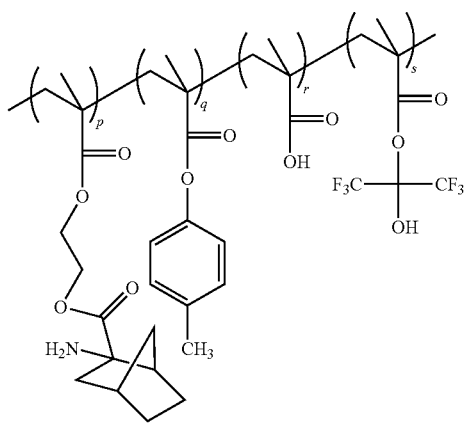

Example 2

4-Acryloylmorpholine, (2-methylanthracen-10-yl)methyl methacrylate and 4-vinylphenol were dissolved in THF in a molar ratio of about 0.3:49.7:50. AIBN was added to into the THF solution including monomers, and then the monomers and the initiator were mixed under a nitrogen atmosphere. A polymerization was carried out by stirring the mixture at a temperature of about 65° C. for about 15 hours. The resulting product was cooled to a room temperature, and was diluted with THF. A polymer was precipitated using an organic solution including petroleum ether and diethyl ether in a volume ratio of about 5:1. As a result, a polymer for anti-reflective coating represented by Formula 8 was obtained. A yield of the polymer was about 82%, and a measured weight-average molecular weight of the polymer was about 8,100. A glass transition temperature of the obtained polymer was at least about 200° C. In an IR spectrum, C—C═O (1658 cm$^{-1}$) peak and O—C═O (1680 cm$^{-1}$) peak were observed.

[Formula 8]

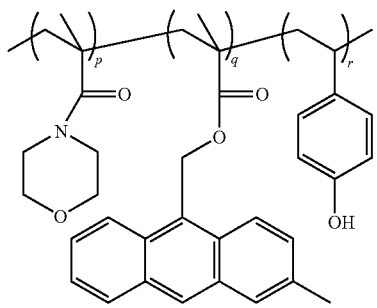

Example 3

Methacrylic acid, 2-hydroxyethyl methacrylate, (2-methylanthracen-10-yl)methyl methacrylate and 4-acryloylmorpholine were dissolved in THF in a molar ratio of about 30:25.44.5:0.5. AIBN was added to into the THF solution including monomers, and then the monomers and the initiator were mixed under a nitrogen atmosphere. A polymerization was carried out by stirring the mixture at a temperature of about 65° C. for about 20 hours. The resulting product was cooled to a room temperature, and was diluted with THF. A polymer was precipitated using an organic solution including petroleum ether and diethyl ether in a volume ratio of about 5:1. As a result, a polymer for anti-reflective coating represented by Formula 9 was obtained. A yield of the polymer was about 87%, and a measured weight-average molecular weight of the polymer was about 10,000. A glass transition temperature of the obtained polymer was at least about 200° C. In an IR spectrum, C—C═O (1658 cm$^{-1}$) peak and O—C═O (1680 cm$^{-1}$) peak were observed.

[Formula 9]

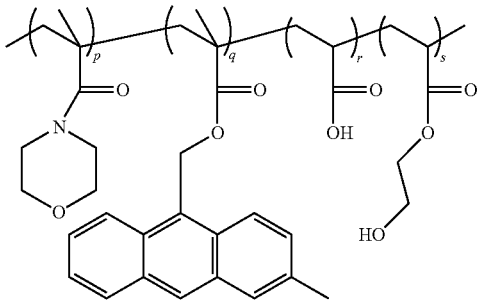

Comparative Example 1 p-Tolyl methacrylate, methacrylic acid and 1,1,1,3,3,3-hexafluoro-2-hydroxypropan-2-yl methacrylate were put into THF in a molar ratio of about 50:25:25 and then heated up to a temperature of about 65° C. AIBN was added to into the THF solution including monomers, and the polymerization was carried out by stirring the mixture at a temperature of about 65° C. for about 15 hours to synthesize a polymer for an anti-reflective coating represented by Formula 10. A yield of the polymer was about 85% and a measured weight-average molecular weight of the polymer was about 7,600. A glass transition temperature of the obtained polymer was at least about 200° C. In an IR spectrum, O—C=O (1680 cm$^{-1}$) peak was observed.

[Formula 10]

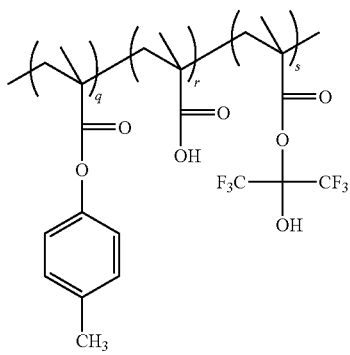

Preparation of Compositions for an Anti-Reflective Coating

Example 4

A composition for an anti-reflective coating was prepared by mixing about 15% by weight of the polymer represented by Formula 7 and prepared in Example 1, about 0.5% by weight of a triphenylsulfonium salt represented by Formula 11 as a photoacid generator, about 5% by weight of a cyclic urea derivative represented by Formula 12 as a cross-linking agent, and about 79.5% by weight of propylene glycol monomethyl ether acetate. A viscosity of the composition was measured to about 3.3 cP.

[Formula 11]

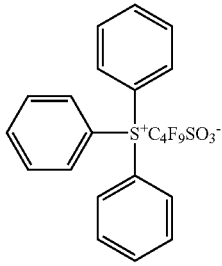

[Formula 12]

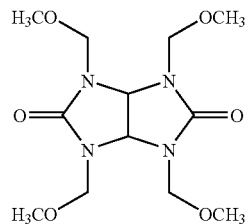

Example 5

A composition for an anti-reflective coating was prepared by substantially the same process as the process of Example 4, with the exception of using the polymer represented by Formula 8 prepared in Example 2 instead of the polymer prepared in Example 1. A viscosity of the composition was measured to about 3.3 cP.

Example 6

A composition for an anti-reflective coating was prepared by substantially the same process as the process of Example 4, with the exception of using the polymer represented by Formula 9 prepared in Example 3 instead of the polymer prepared in Example 1. A viscosity of the composition was measured to about 3.3 cP.

Comparative Example 2

A composition for an anti-reflective coating was prepared by substantially the same process as the process of Example 4, with the exception of using the polymer represented by Formula 10 prepared in Comparative Example 1 instead of the polymer prepared in Example 1. A viscosity of the composition was measured to about 3.3 cP.

Comparative Example 3

A composition for an anti-reflective coating was prepared by mixing about 15% by weight of the polymer represented by Formula 10 and prepared in Comparative Example 1, about 0.5% by weight of a triphenylsulfonium salt represented by Formula 11 as a photoacid generator, about 5% by weight of a cyclic urea derivative represented by Formula 12 as a cross-linking agent, about 0.5% by weight of triethylamine as a base additive and about 79% by weight of propylene glycol monomethyl ether acetate. A viscosity of the composition was measured to about 3.3 cP.

Evaluation of a Profile of a Pattern

Profiles of patterns formed using the compositions for an anti-reflective coating prepared in Examples 4 to 6, Comparative Example 2 and Comparative Example 3 were evaluated.

Each (bottom) anti-reflective coating layer was formed on a silicon wafer by coating the silicon wafer with the composition for the anti-reflective coating, and then by baking the silicon wafer at a temperature of about 180° C. for about 60 seconds. A thickness of the anti-reflective coating layer was about 600 Å. A coating process was performed with a rotational speed of about 1,500 rpm. A photoresist film was formed on the anti-reflective coating layer by coating the silicon wafer with a commercial photoresist composition for KrF. A baking process was performed at a temperature of about 110° C. for about 60 seconds to remove solvent. A thickness of the photoresist film was about 5,000 Å. A coating process was performed with a rotational speed of about 1,500 rpm. An exposure process and a developing process were performed on the photoresist film and the anti-reflective coating layer to form a pattern structure on the silicon wafer. The exposure process was carried out by using a KrF light source and dosing energy of about 30 mJ. After the exposure process, the silicon wafer was baked at a temperature of about 110° C. for about 60 seconds to induce diffusion of an acid. ASML 850 was used as an exposure apparatus, and a numerical aperture (NA) was about 0.85. A distance between the pattern structures was about 200 nm. The pattern structure included an anti-reflective coating layer pattern and a photoresist pattern on the anti-reflective coating layer pattern. A cross-section of the pattern structure was observed using an electronic microscope.

Figure 2:
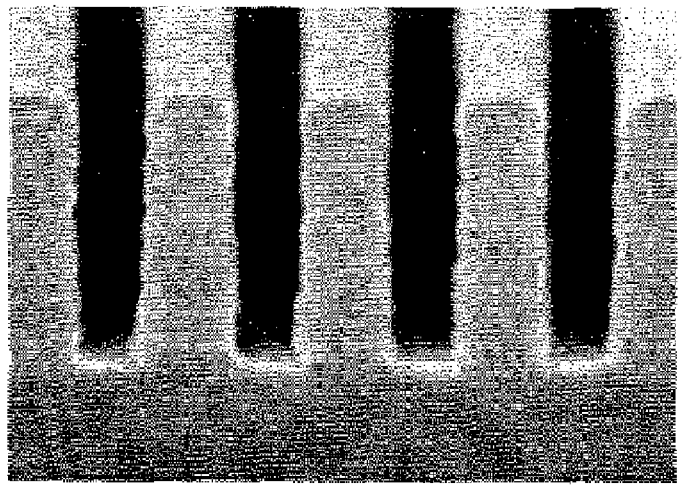
Figure 3:
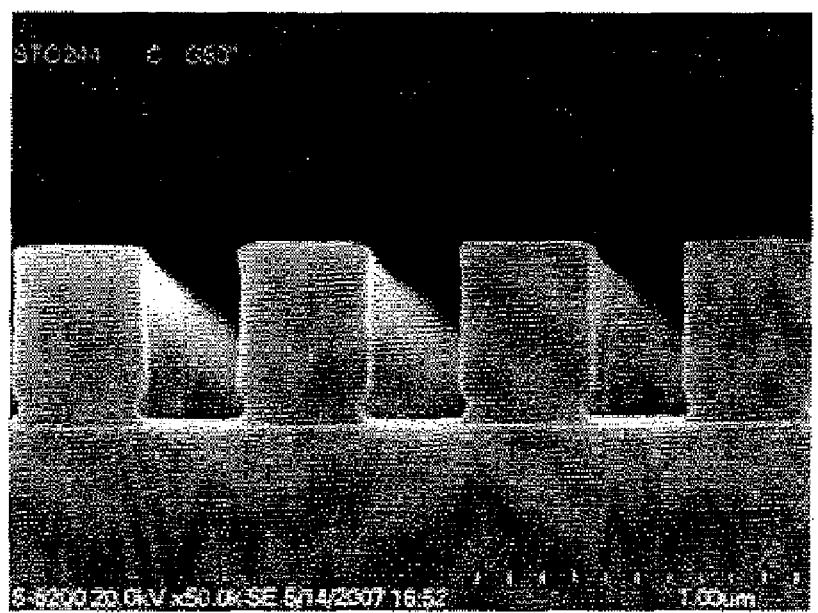

FIG. 2 is an electronic microscopic picture showing a pattern structure formed using the composition prepared in Example 4, and FIG. 3 is an electronic microscopic picture showing a pattern structure formed using the composition prepared in Comparative Example 3.

Referring to FIGS. 2 and 3, the pattern structure formed using the composition prepared in Examples 4 showed an improved profile of a pattern; whereas the pattern structure formed using the composition prepared in Comparative Example 3 exhibited a relatively poor profile of a pattern, e.g., undercut phenomena, which is a recess at a lower portion of the pattern structure. The lower portion of the pattern structure corresponds to the anti-reflective coating layer pattern. In addition, the pattern structure formed using the composition of Examples 5 or 6 showed a relatively excellent profile in a similar manner to the patterned structure formed using the composition of Example 4, and the pattern structure formed using the composition of Comparative Example 2 showed a relatively poor profile in a similar manner to the patterned structure formed using the composition of Comparative Example 3.

Accordingly, it may be noted from the results regarding the pattern profile that the basic side group chemically bound to a backbone of the polymer may improve the pattern profile by controlling or suppressing diffusion of an acid from an exposed portion to an unexposed portion of the anti-reflective coating layer. The acid may be generated from the exposed portion of the anti-reflective coating layer and/or may be transferred from an exposed portion of the photoresist film on the anti-reflective coating layer. It may also be confirmed that the basic additive used in Comparative Example 3 may not properly control diffusion of an acid in the anti-reflective coating layer to produce a poor pattern profile, because the basic additive isn't chemically bound to the polymer and can freely diffuse toward the photoresist film to be dissolved in the photoresist film.

Figure 4A:
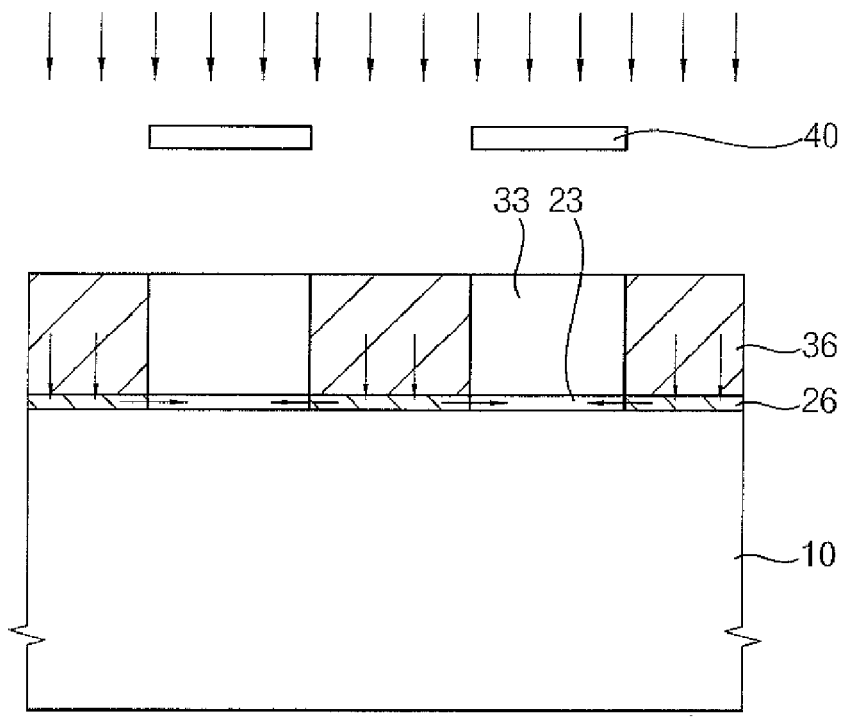
Figure 4B:
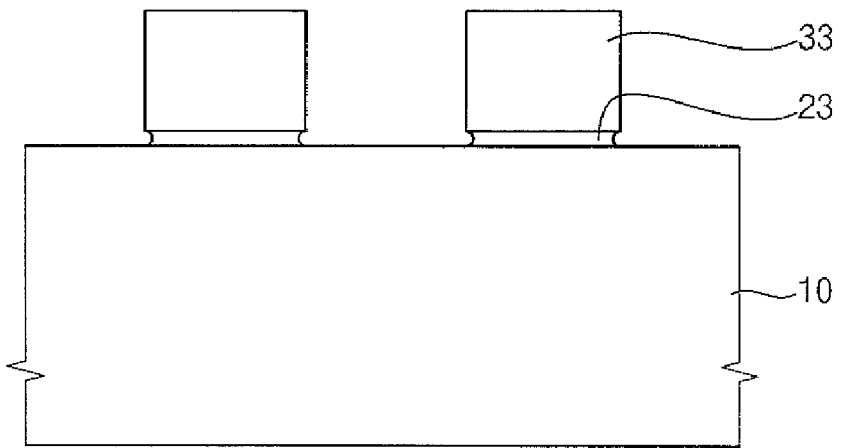

FIGS. 4A and 4B are cross-sectional views illustrating undercut of a pattern structure formed using the compositions prepared in Comparative Examples 2 and 3.

Referring to FIGS. 4A and 4B, an exposure process may be carried out by exposing an anti-reflective coating layer 23 and 26 and a photoresist film 33 and 36 to light passing through a photo mask 40, and an acid (H⁺) may be generated in exposed portions 26 and 36 of the anti-reflective coating layer and the photoresist film. The acid generated in the exposed portion 36 of the photoresist film may readily move to the exposed portion 26 of the anti-reflective coating layer. The exposed portion 26 of the anti-reflective coating layer may have an excessive amount of acid due to acid transferred from the photoresist film as well as acid generation of itself. Such an excessive acid existing in the exposed portion 26 of the anti-reflective coating layer may readily diffuse toward an unexposed portion 23 of the anti-reflective coating layer, and acid diffused to the unexposed portion 23 may cause unintended breakage of cross-linking between polymer chains. Accordingly, edge portions of the unexposed portion 23 of the anti-reflective coating layer may be unintentionally removed in a developing process to generate undercut of a pattern structure.

The composition prepared in Comparative Example 2 does not include any basic additive or polymer having a basic side group, and thus acid diffusion from the exposed portion 26 to the unexposed portion 23 may not be prohibited. However, the compositions prepared in Examples 4 to 6 may include a polymer having a basic side group which may suppress or reduce such acid diffusion from the exposed portion 26 to the unexposed portion 23, and therefore undercut of a pattern structure may also be reduced sufficiently.

The composition prepared in Comparative Example 3 includes a basic component as an additive, which is not attached or bound to a polymer chain and can be dissolved in or diffused to an adjacent photoresist film. Therefore, the basic additive may not efficiently suppress acid diffusion. However, the compositions prepared in Examples 4 to 6 may include a polymer having a basic side group which is chemically bound to the polymer, and thus loss of the basic component may not be generated. Accordingly, the composition including the polymer having a basic side group may effectively inhibit acid from diffusing from the exposed portion 26 to the unexposed portion 23 and also reduce undercut of a pattern structure.

According to example embodiments, the polymer for the anti-reflective coating may include a basic side group having a nitrogen atom to suppress diffusion of an acid which may be generated from an exposed portion of an anti-reflective coating layer or transferred from a photoresist film. Therefore, the polymer may inhibit undercut of a pattern structure and also greatly improve a profile of a pattern.

Further, the composition may include a polymer having a basic side group which is chemically bound to the polymer, and thus the basic component of the anti-reflective coating layer may be prevented from being dissolved in an adjacent photoresist film. Accordingly, the composition including such polymer may effectively inhibit acid diffusion in the anti-reflective coating layer to improve a profile of a pattern structure.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of forming a pattern of a semiconductor device, comprising:
   forming an anti-reflective coating layer on a substrate using a composition that includes a polymer, a photoacid generator, a cross-linking agent and a solvent, the polymer including a first repeating unit represented by Formula 1 and having a basic side group, a second repeating unit having a light-absorbing group, and a third repeating unit having a cross-linkable group;
   forming a photoresist film on the anti-reflective coating layer;
   exposing the photoresist film and the anti-reflective coating layer to light; and
   developing the photoresist film and the anti-reflective coating layer to form a photoresist pattern and an anti-reflective coating layer pattern on the substrate,

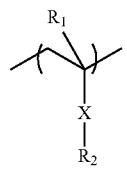

[Formula 1]

wherein $R_1$ is a hydrogen atom or $C_1$-$C_4$ lower alkyl, —X— is a divalent group selected from the group consisting of alkylene, arylene, oxyalkylene, alkyleneoxy, oxyarylene, aryleneoxy, carbonyl, oxy, oxycarbonyl, carbonyloxy, carbonylalkylene, carbonylarylene, alkylenecarbonyl, arylenecarbonyl and combinations thereof, and $R_2$ is the basic side group having nitrogen, the basic side group being selected from the group consisting of amino; alkylamino; alkenylamino; arylamino; alkanoylamino; alkyl, alkenyl, cycloalkyl, cycloalkenyl and aryl, each of which is substituted by at least one selected from amino, alkylamino, alkenylamino, arylamino and alkanoylamino; and heterocycloalkyl, heterocycloalkenyl and heteroaryl, each of which has a nitrogen hetero atom, and wherein the polymer comprises the first repeating unit in a range of about 0.1 to about 0.5% by weight, based on a total weight of the polymer.

2. The method of claim 1, wherein the forming of the anti-reflective coating layer on the substrate comprises:
   coating the substrate with the composition to form a coating layer of the composition on the substrate; and
   baking the coating layer of the composition at a temperature of about 150 to about 250° C.

3. The method of claim 1, wherein the photoresist film and the anti-reflective coating layer are exposed to the light through a photomask.

4. The method of claim 3, wherein after performing the exposure process and prior to performing the developing process, the photoresist film is divided into an exposed portion and an unexposed portion and the anti-reflective coating layer is divided into an exposed portion and an unexposed portion.

5. The method of claim 4, wherein, the developing process includes selectively removing the exposed portion of the photoresist film and the exposed portion of the anti-reflective coating layer to form the photoresist pattern and the anti-reflective coating layer pattern on the substrate using a basic developing solution.

6. The method of claim 1, wherein $R_2$ is selected from the group consisting of morpholinyl, amino-substituted norbonanyl, amino, methylamino, ethylamino, dimethylamino, aminoethyl, aminopropyl, aminobutyl, aminocyclohexyl, amino-substituted adamantanyl, aminophenyl, pyrrolidinyl, pyrrolyl, piperidinyl, piperazinyl, pyrazinyl, pyridinyl, pyrimidinyl and imidazolyl.

7. The method of claim 6, wherein $R_2$ is morpholinyl.

8. The method of claim 6, wherein $R_2$ is amino-substituted norbonanyl.

9. The method of claim 1, wherein the polymer has a weight-average molecular weight of about 5,000 to about 10,000.

10. The method of claim 1, wherein the polymer is represented by Formula 2,

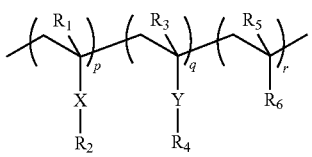

[Formula 2]

wherein $R_1$, $R_3$ and $R_5$ are independently a hydrogen atom or $C_1$-$C_4$ alkyl, —X— and —Y— are independently a divalent group selected from the group consisting of alkylene, arylene, oxyalkylene, alkyleneoxy, oxyarylene, aryleneoxy, carbonyl, oxy, oxycarbonyl, carbonyloxy, carbonylalkylene, carbonylarylene, alkylenecarbonyl, arylenecarbonyl and combinations thereof, $R_2$ is the basic side group having nitrogen, the basic side group being selected from the group consisting of amino; alkylamino; alkenylamino; arylamino; alkanoylamino; alkyl, alkenyl, cycloalkyl, cycloalkenyl and aryl, each of which is substituted by at least one selected from amino, alkylamino, alkenylamino, arylamino and alkanoylamino; and heterocycloalkyl, heterocycloalkenyl and heteroaryl, each of which has a nitrogen hetero atom, $R_4$ is a light-absorbing group, $R_6$ is carboxyl; hydroxyl; or alkyl, cycloalkyl, aryl, haloalkyl, alkoxy, haloalkoxy, alkoxycarbonyl or haloalkoxycarbonyl, each of which is substituted by at least one of carboxyl and hydroxyl, p, q and r satisfy $0<p<1$, $0<q<1$, $0<r<1$ and $p+q+r=1$.

11. The method of claim 10, wherein the polymer is represented by Formula 4,

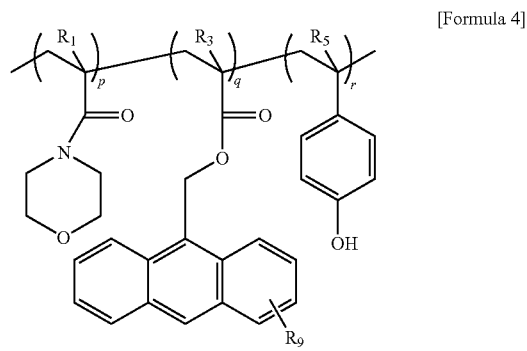

[Formula 4]

wherein $R_1$, $R_3$ and $R_5$ are independently a hydrogen atom or $C_1$-$C_4$ alkyl, $R_9$ is selected from the group consisting of a hydrogen atom, a halogen atom, hydroxyl, alkyl, cycloalkyl, hydroxylalkyl, haloalkyl, carboxyl, alkylcarboxyl, alkylcarbonyl, alkoxycarbonyl and alkylcarbonyloxy, and p, q and r satisfy $0<p<1$, $0<q<1$, $0<r<1$ and $p+q+r=1$.

12. The method of claim 1, wherein the polymer is represented by Formula 3,

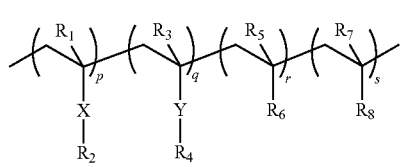

[Formula 3]

wherein $R_1$, $R_3$, $R_5$ and $R_7$ are independently a hydrogen atom or $C_1$-$C_4$ alkyl, —X— and —Y— are independently a divalent group selected from the group consisting of alkylene, arylene, oxyalkylene, alkyleneoxy, oxyarylene, aryleneoxy, carbonyl, oxy, oxycarbonyl, carbonyloxy, carbonylalkylene, carbonylarylene, alkylenecarbonyl, arylenecarbonyl and combinations thereof, $R_2$ is the basic side group having nitrogen, the basic side group being selected from the group consisting of amino; alkylamino; alkenylamino; arylamino; alkanoylamino; alkyl, alkenyl, cycloalkyl, cycloalkenyl and aryl, each of which is substituted by at least one selected from amino, alkylamino, alkenylamino, arylamino and alkanoylamino; and heterocycloalkyl, heterocycloalkenyl and heteroaryl, each of which has a nitrogen hetero atom, $R_4$ is a light-absorbing group, $R_6$ and $R_8$ are different from each other and selected from carboxyl; hydroxyl; and alkyl, cycloalkyl, aryl, haloalkyl, alkoxy, haloalkoxy, alkoxycarbonyl and haloalkoxycarbonyl, each of which is substituted by at least one of carboxyl and hydroxyl, and p, q, r, and s satisfy $0<p<1$, $0<q<1$, $0<r<1$, $0<s<1$ and $p+q+r+s=1$.

13. The method of claim 12, wherein the polymer is represented by Formula 5,

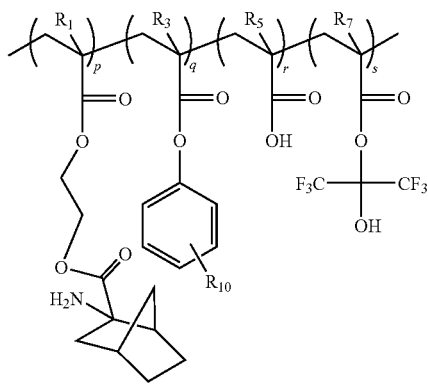

[Formula 5]

wherein $R_1$, $R_3$, $R_5$ and $R_7$ are independently a hydrogen atom or $C_1$-$C_4$ alkyl, $R_{10}$ is selected from the group consisting of a hydrogen atom, a halogen atom, hydroxyl, alkyl, cycloalkyl, hydroxylalkyl, haloalkyl, carboxyl, alkylcarboxyl, alkylcarbonyl, alkoxycarbonyl and alkylcarbonyloxy, and p, q, r and s satisfy $0<p<1$, $0<q<1$, $0<r<1$, $0<s<1$ and $p+q+r+s=1$.

14. The method of claim 12, wherein the polymer is represented by Formula 6,

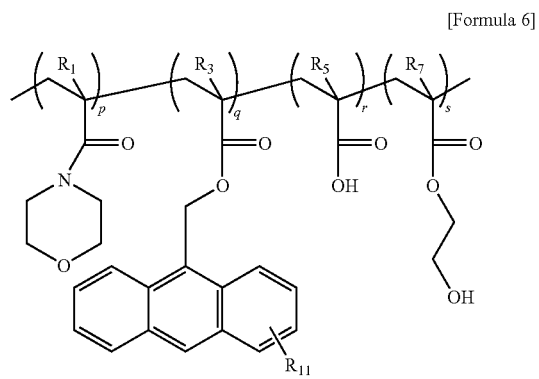

[Formula 6]

wherein $R_1$, $R_3$, $R_5$ and $R_7$ are independently a hydrogen atom or $C_1$-$C_4$ alkyl, $R_{11}$ is selected from the group consisting of a hydrogen atom, a halogen atom, hydroxyl, alkyl, cycloalkyl, hydroxylalkyl, haloalkyl, carboxyl, alkylcarboxyl, alkylcarbonyl, alkoxycarbonyl and alkylcarbonyloxy, and p, q, r and s satisfy $0<p<1$, $0<q<1$, $0<r<1$, $0<s<1$ and $p+q+r+s=1$.

15. The method of claim 1, wherein the composition comprises about 1 to about 25% by weight of the polymer, about 0.001 to about 10% by weight of the photoacid generator, about 0.1 to about 20% by weight of the cross-linking agent and a remainder of the solvent.

\* \* \* \* \*